United States Patent
Naidu et al.

(10) Patent No.: US 10,224,881 B2
(45) Date of Patent: *Mar. 5, 2019

(54) SYSTEMS AND METHODS USING DIGITAL PREDISTORTION TO LINEARIZE RADIO TRANSMITTER OPERATION

(71) Applicant: Meteorcomm LLC, Renton, WA (US)

(72) Inventors: Arun Naidu, Woodinville, WA (US); Jonathan Morarity, Seattle, WA (US)

(73) Assignee: Meteorcomm LLC, Renton, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/484,030

(22) Filed: Apr. 10, 2017

(65) Prior Publication Data
US 2017/0324384 A1 Nov. 9, 2017

Related U.S. Application Data

(63) Continuation of application No. 14/606,446, filed on Jan. 27, 2015, now Pat. No. 9,628,030.

(60) Provisional application No. 62/007,991, filed on Jun. 5, 2014.

(51) Int. Cl.
| H04K 1/02 | (2006.01) |
| H04L 25/03 | (2006.01) |
| H04L 25/49 | (2006.01) |
| H03F 1/32 | (2006.01) |
| H04L 25/08 | (2006.01) |
| H03F 3/19 | (2006.01) |
| H03F 3/24 | (2006.01) |
| H04L 5/14 | (2006.01) |

(52) U.S. Cl.
CPC .......... *H03F 1/3258* (2013.01); *H03F 1/3247* (2013.01); *H03F 3/19* (2013.01); *H03F 3/245* (2013.01); *H04L 25/03* (2013.01); *H04L 25/08* (2013.01); *H03F 2200/451* (2013.01); *H03F 2201/3215* (2013.01); *H04L 5/1461* (2013.01)

(58) Field of Classification Search
CPC .......... H03F 1/3258; H03F 2201/3215; H03F 2200/451; H03F 3/19; H04L 25/08; H04L 5/1461; H04L 5/143; H04L 25/03
USPC .................................................. 375/296, 297
See application file for complete search history.

(56) References Cited

U.S. PATENT DOCUMENTS

| 6,075,411 | A | * | 6/2000 | Briffa | H03F 1/3247 330/149 |
| 9,628,030 | B1 | * | 4/2017 | Naidu | H03F 1/3258 |
| 2002/0171485 | A1 | * | 11/2002 | Cova | H03F 1/3247 330/136 |

* cited by examiner

*Primary Examiner* — Phuong Phu
(74) *Attorney, Agent, or Firm* — Hubbard Johnston, PLLC

(57) ABSTRACT

A method of linearizing a relationship between a signal to an amplifier and an output signal from the amplifier includes applying an inverse of a transfer function of the amplifier to the signal prior to presenting the signal as the amplifier input. The inverse transfer function is represented by a polynomial defined by a set of coefficients. The transmitter output signal is measured by the idle receiver in a time division duplex system. The output signal is filtered to isolate intermodulation products of a selected order and the peak power of the isolated intermodulation products is then estimated. An adaptive algorithm is applied in response to the estimate of the peak power to update the set of coefficients of the polynomial representing the inverse of the transfer function of the amplifier.

18 Claims, 18 Drawing Sheets

SYSTEMS AND METHODS USING DIGITAL PREDISTORTION TO LINEARIZE RADIO TRANSMITTER OPERATION

CROSS-REFERENCE TO RELATED APPLICATION

This application is a continuation of U.S. application Ser. No. 14/606,446 filed Jan. 27, 2015, which claims the benefit of U.S. Provisional Patent Application Ser. No. 62/007,991, filed Jun. 5, 2014, both of which are incorporated herein by reference for all purposes.

FIELD OF INVENTION

The present invention relates in general to wireless communications techniques, and in particular systems and methods using digital predistortion to linearize radio transmitter operation.

BACKGROUND OF INVENTION

In any transportation industry, reliable communications systems are mandatory for avoiding serious, if not catastrophic, accidents. In the particular case of the railroads, the railroad central offices normally communicate through wired telecommunications links with a network of radio base stations, which are typically dispersed over very large geographical areas. The radio base stations in turn maintain wireless communication links with locomotives, service vehicles, and wayside systems operating within the base station coverage areas.

In designing and operating a communications system for a transportation industry, a number of different constraints must be addressed. In the railroad industry, for example, a reliable and efficient communications system must be capable of handling different types of information, including data transmitted from the railroad central office and wayside systems to the locomotive on-board computers, as well as voice transmissions between train crews and the central office.

One particularly critical application for wireless communications is in interoperability positive train control systems. A positive train control (PTC) system is a system that is designed for the express purpose of preventing train-to-train collisions, over-speed derailments, incursions into established work zone limits, and the movement of a train through a switch left in the wrong position. A PTC system is "interoperable" if it allows locomotives of a host railroad and a tenant railroad to communicate with and respond to the PTC system, while supporting uninterrupted movements over property boundaries. Interoperability PTC (IPTC) systems have been mandated for some railroads under the Rail Safety Improvement Act of 2008 (Public Law 110-432 of 2008).

Any wireless system communication system used in an IPTC system must not only meet the requirements and goals of the Rail Safety Improvement Act of 2008, but also must meet the transmission band requirements mandated by the Federal Communications Commission (FCC), including, for example, those related to frequency band allocation, channel width and spacing. Moreover, in addition to meeting all of the government imposed requirements, an IPTC system must also meet all of the engineering demands placed on any system being deployed in the harsh railroad operating environment.

SUMMARY OF INVENTION

The principles of the present invention are embodied in systems and methods for linearizing the relationship between amplifier input and output signals using digital predistortion. An inverse of a transfer function of the amplifier, which is represented by a polynomial with a given set of coefficients, is applied to the input signal prior to presenting the input signal the amplifier input. The amplifier output signal is filtered to isolate intermodulation products of a selected order and the peak power of the isolated intermodulation products is then estimated. A differential gradient descent algorithm is applied in response to the estimated peak power to update the set of polynomial coefficients.

Embodiments of the present principles are particularly advantageous in radios having asynchronous transmit and receive operations. By linearizing the amplifier response, amplifier efficiency can be maximized while intermodulation products in the output signal are minimized. Among other things, the minimization of the intermodulation products minimizes the generation of out-of-band signals, which is particularly important in scenarios where strict bandwidth controls are in place, such as in ITPC.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-19 of the drawings, in which like numbers designate like parts.

Figure 1:
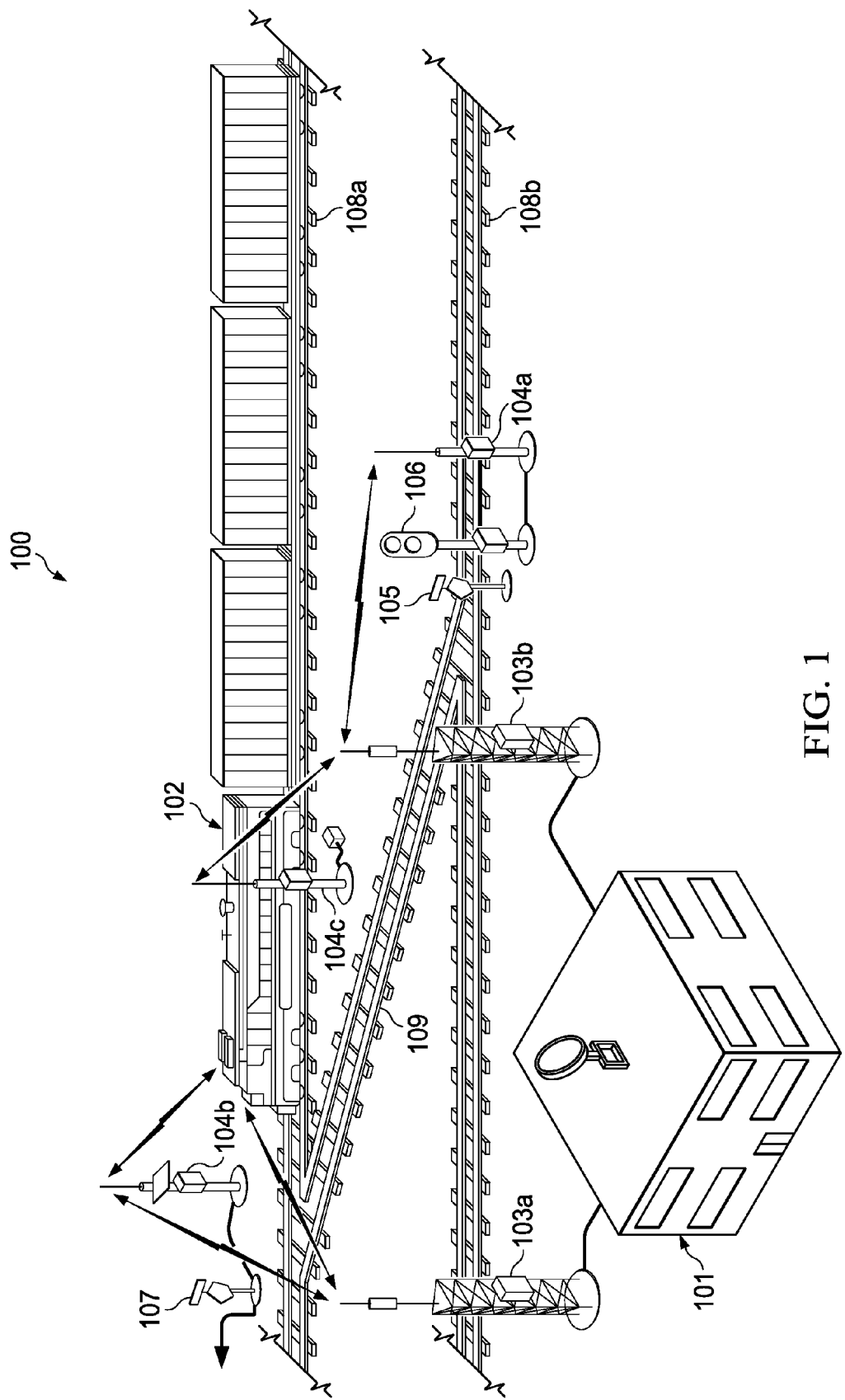
FIG. 1 is a high level block diagram of a small portion of a representative communications system used in the railroad industry and suitable for describing a typical application of the present inventive principles.

FIG. 1 is high-level diagram showing a small portion of a railroad communications system 100 embodying the principles of the present invention. Generally, system 100 supports wireless communications between a central office (network operating center) 101 and locomotives 102 and other railroad vehicles located at various points around a rail system, as well as direct wireless communications between locomotives 102 and the electronic wayside monitoring subsystems, discussed below in detail.

In communications system 100, central office 101 communicates with packet data radios on locomotives 102 through a wired telecommunications network and a series of packet radio base stations dispersed over thousands of square miles of geographical area through which the rail system operates. In the diagram of FIG. 1, two radio base stations 103a and 103b are shown for discussion purposes.

Communications system 100 also includes a series of wayside monitoring subsystems, which monitor wayside systems such as signals, switches, and track circuits and wirelessly communicate the collected information directly to locomotives 102 within the corresponding wireless coverage area, as well as to central office 101, though base stations 103. FIG. 1 shows three representative wayside monitoring subsystems 104a-104c. As examples of typical uses of wayside monitoring subsystems 104, wayside monitoring subsystem 104a is shown monitoring a switch 105 and a signal 106, and wayside monitoring subsystem 104b is shown monitoring a hand-throw switch 107. Also for illustrative purposes, two parallel sections of track 108a and 108b and a connecting section 109 are shown in FIG. 1, which represent only a very small part of the overall track system.

Generally, "remote" radios means radios disposed on locomotives 102 and other railroad vehicles, the wayside radios at waysides monitoring subsystems 104, and other radios, which are geographically separated from central office 101 and are not the radios at radio base stations 103. "Mobile" remote radios are those radios disposed on locomotives 102 and other railroad vehicles.

One challenge with such IPTC applications is the need to maintain multiple communications paths between various communications nodes within the system. More specifically, these multiple communications paths must support the exchange of different types of information while still meeting all of the wireless regulatory requirements imposed by the FCC.

For example, a communication path must be maintained between the mobile remote radios on locomotives 102 and central office 101 to support the exchange of such information as locomotive location reports, locomotive health and diagnostic data, movement authorities, files, and network management data. Another communication path must be established between the mobile remote radios on railroad non-locomotive vehicles (not shown) and the central office 101. The data traffic in this path includes vehicle location reports, work reports, email, and material requisitions.

Another set of communication paths are required for maintaining communications with the fixed remote radios at railroad wayside monitoring subsystems 104. In this case, a communication path is required between the radios of wayside monitoring subsystems 104 and central office 101 for supporting signal system health and status monitoring, centralized control of control points, and wayside defect detector system data and alarms. A further communication path is required between the mobile remote radios on locomotives 102 and the fixed remote radios at wayside monitoring subsystems 104, which supports wayside status updates provided to locomotives 102 in the proximity of a given set of waysides. (In a PTC system, trains require a status update from each approaching wayside. For each wayside monitoring subsystem 104 within 3.5 miles ahead of a train, the age of the wayside status data must not exceed 12 seconds with six 9 sigma (i.e., 99.9999%) reliability. It is also desirable that the wayside status updates are forwarded to central office 101.)

Finally, another communications path is required between the mobile remote radios on locomotives 102 and non-locomotive railroad vehicles and the mobile remote radios on other locomotives 102 and non-locomotive railroad vehicles.

For IPTC applications, the FCC has allocated frequency channels in the 222 MHz band for providing all wireless data communication paths in the IPTC system. According to current FCC regulations, a mobile radio may transmit or receive on either a mobile radio or base radio frequency, while a base radio can transmit only on a base radio frequency. In the future, the FCC may also allow a base radio to transmit on a mobile radio frequency, subject to certain to antenna height and power restrictions. For example, a base radio transmitting on a mobile radio frequency may be restricted to antennas of less than 7 meters in height or to powers less that 50 Watts ERP.

The multi-channel capability of a software defined radio (SDR) provides several advantages, particularly in railroad applications. Among other things, with multi-channel capability, a locomotive 102 can receive information from a base station 103 and a wayside monitoring subsystem 104 simultaneously. Additionally, locomotives 102 and base stations 103 can receive status messages from multiple wayside monitoring subsystems 104 simultaneously. This in turn provides the ability to support communications with a high density of waysides in city areas, which is highly desirable in IPTC systems. Suitable SDRs are disclosed in U.S. Pat. No. 8,279,796, U.S. Pat. No. 8,340,056. U.S. Pat. No. 8,374,291, and U.S. Pat. No. 8,605,754, which are incorporated herein for all purposes.

One particular challenge is to maximize the wayside radio symbol rate while still meeting the FCC spectral emissions requirements. According to the present inventive principles, the wayside radios within wayside monitoring subsystems 104 can provide a 16 ksym/s symbol rate (32 kbps) using n/4 DQPSK modulation while still meeting the FCC mask. The 16 ksym/s symbol rate, which is also used by the base and locomotive radios in system 100, provides a number of significant advantages, including: (1) an overall system throughput improvement, as less time is consumed by wayside transmissions; (2) a reduction in embedded software complexity throughout the system; and (3) a reduction in the number of test cases for system validation.

Possible ways of achieving a 16 ksym/s modulation rate, while still meeting the corresponding FCC mask is to design and build a new linear transmitter for the wayside radios. However, the time, expense, and effort required to design, build, and test a new linear transmitter can be significant. In addition, retrofitting existing wayside radios with new transmitters in the field can itself be cost prohibitive.

According to the present inventive principles, baseband predistortion techniques are used to linearize the operation of the radio transmitter hardware. Advantageously, these techniques can be applied equally to the transmitter hardware of new radios, was well as that of radios within wayside monitoring subsystems 104 already deployed in the field. Generally, digital predistortion linearizes the input/output relationship between the signal to be transmitted and the resulting amplified RF output, which makes it possible to transmit at higher power with less distortion and less out-of-band signal leakage.

Figure 2A:
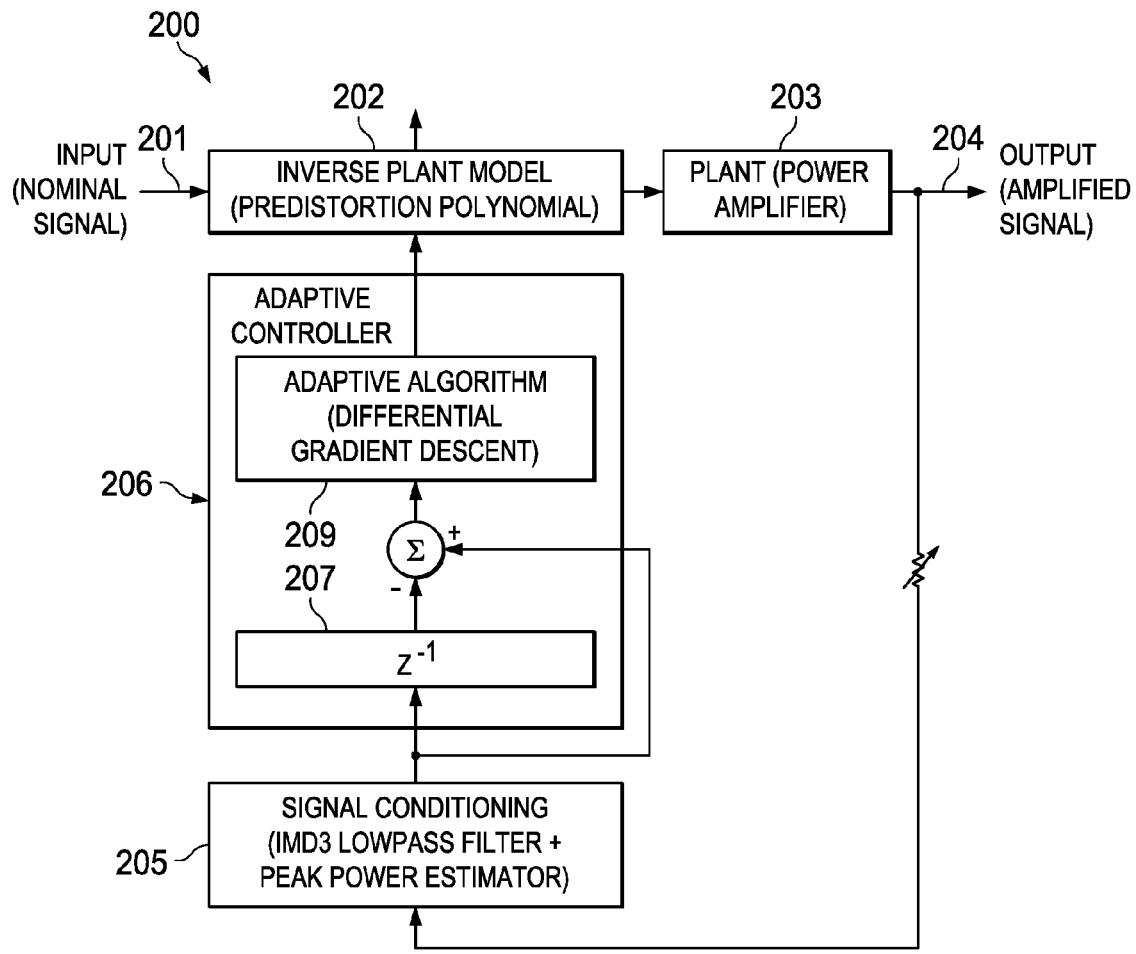
FIG. 2A is a block diagram of a representative digital predistortion system embodying the inventive principles and suitable, for example, for use in the wayside radios shown in FIG. 1.

FIG. 2A shows a preferred digital predistortion (DPD) system 200 according to the present principles. A nominal input signal 201 is passed through an inverse plant model 202 and then through a radio transmitter power amplifier ("plant") 203, which provides the amplified output signal 204. Linearization is accomplished by estimating the transfer function through transmitter power amplifier 203 and then pre-applying the inverse transfer function with inverse plant model 202 such that the gain through the cascaded system is linearly proportional to input power. These linearization steps are performed by signal conditioning block 205 and adaptive controller 206, which implements a delay 207 and adaptive algorithm 209. Signal conditioning block 205 and adaptive controller 206 are discussed in detail below.

In a static environment, this inverse transfer function (estimated as a polynomial in the time domain) can be obtained and applied in an open-loop fashion. However, when a more realistic dynamic environment is considered (e.g., changing temperature, voltage, power reflection, etc.), an adaptive mechanism is required to update the polynomial coefficients and maintain linear operation of plant 203 under varying conditions. Therefore, in the preferred embodiment, predistortion system 200 operates during every transmit burst (i.e. when the radio transmitter is on and the receiver is available to gather feedback), which allows for variations in temperature and voltage over time.

Figure 2B:
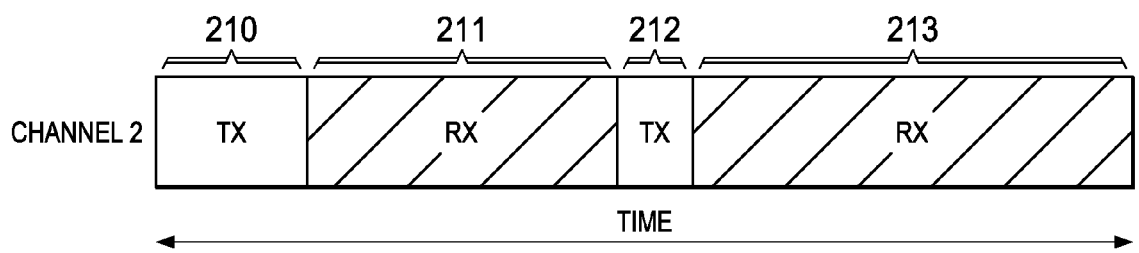
FIG. 2B is a conceptual diagram showing the timing relationship between transmit (TX) and receive (RX) operations in radio operating in a time domain duplexing (TDD) mode.

Although not limited thereto, digital distortion system 200 is particularly advantageous when used in radios operating in a time domain duplexing (TDD) mode. The timing of typical TDD mode operations is shown in FIG. 2B, where the transmit (TX) and receive (RX) operations do not overlap. A TX time period 210 is followed by a RX time period 211, which in turn is followed by another TX time period 212 and another RX time period 213. The pattern shown in FIG. 2B repeats during TDD mode radio operations.

Figure 2C:
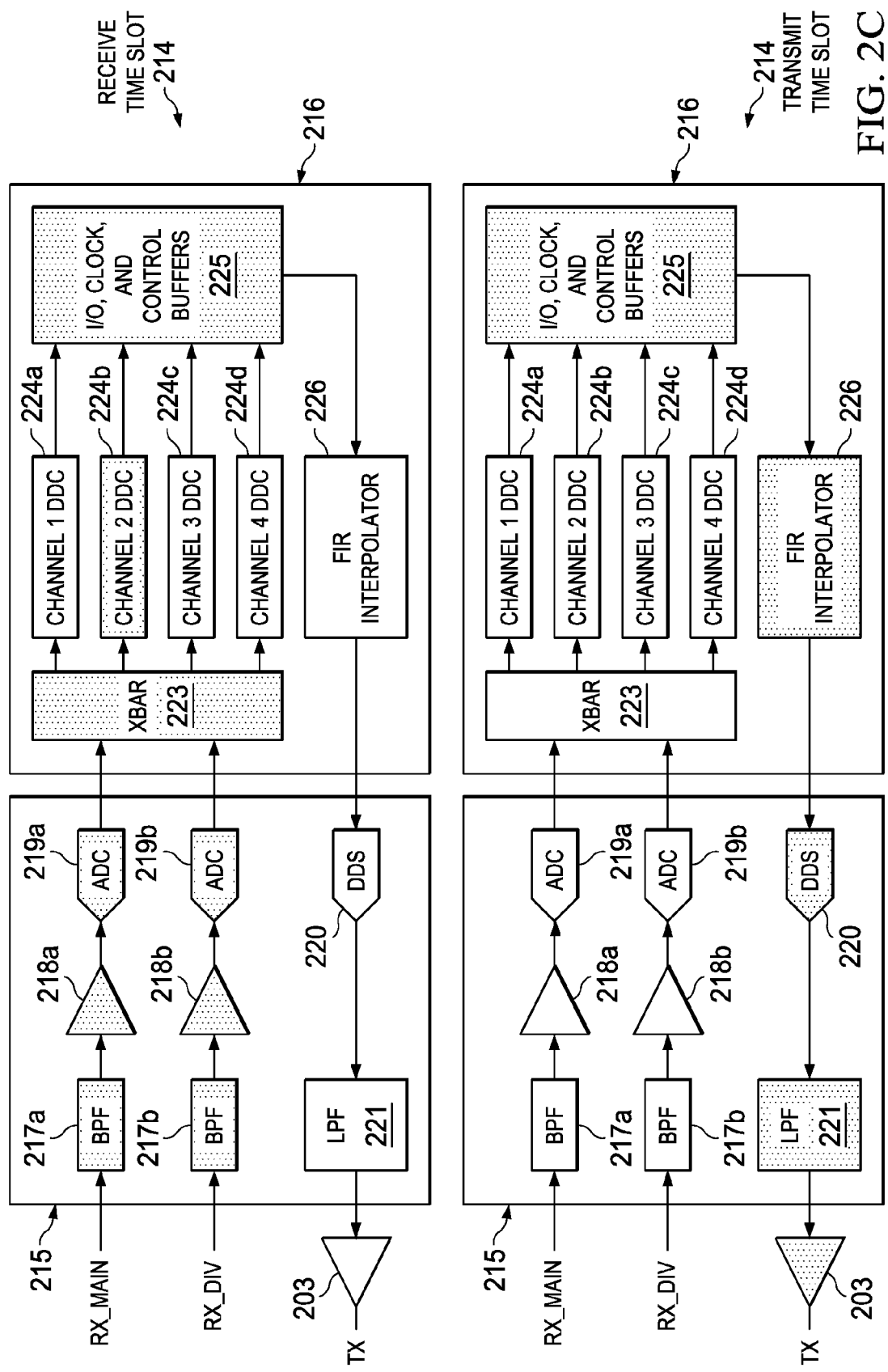
FIG. 2C illustrates the exemplary RX and TX operations in a radio operating in the TDD mode without a digital predistortion system.

FIG. 2C shows typical operations of a radio 214, such as that disclosed in U.S. Pat. No. 8,279,796, which is incorporated herein for all purposes, when operating in the TDD mode. Generally, radio 214 includes an analog (RF) section 215 and a digital processing section 216. Analog section 215 includes two receive paths respectively receiving RF signals RX_Main and RX_Div. Each receive path includes a bandpass filter (8PF) 217, amplifier 218, and analog to digital converter (ADC) 219. Analog section 215 also includes a transmit path having direct data synthesizer 220 and a lowpass filter (LPF) 221. The transmit path drives plant 203.

Digital processing section 216 includes a crossbar 223, which selects between the receive paths of analog section 215, a set of digital down converters (DDCs) 224a-224b for processing receive Channels 1-4, and an 1/0, clock, and control buffers section 225. A FIR interpolator 226 provides transmit data to the transmit path of analog section 215.

For discussion purposes, Channel 2 operations are shown as an example, although the other channels of a multi-channel radio, such as radio 214, as well as single-channel radios, operate in a similar fashion. The upper section of FIG. 2C illustrates the RX operations, with the active receive blocks shaded, and the lower section of FIG. 2C illustrates the TX operations, with the active transmit blocks shaded.

Generally, during the RX operations in the exemplary multiple-channel radio, the two signals RX_MAIN and RX_DIV are received, filtered, converted from analog to digital form by the corresponding receive paths of analog section 215, and then multiplexed by crossbar 223 to the input of the Channel 2 direct data converter (DOC) 224b for downconversion and baseband processing. The TX path though both analog section 215 and digital processing section 216 is inactive during RX operations. Conversely, when the TX path is operating, the RX paths of the radio are inactive.

Figure 2D:
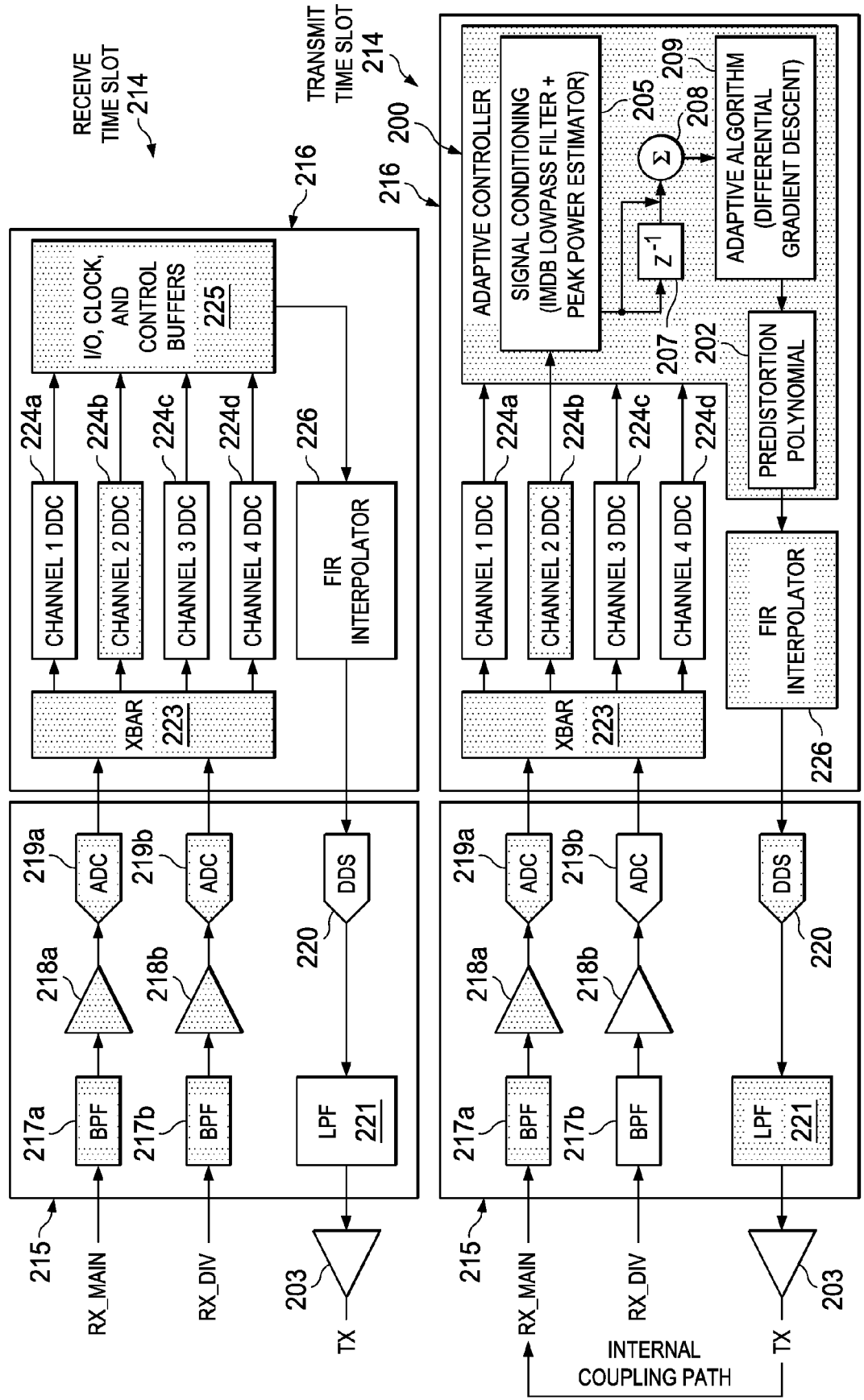
FIG. 2D illustrates exemplary RX and TX operations in a radio using the digital predistortion system of FIG. 2A while operating in the TDD mode.

FIG. 2D generally show operations of a radio operating in the TDD mode and using DPD system 200 of FIG. 2A. The upper section of FIG. 2C illustrates the RX operations, with the active receive blocks shaded, and the lower section of FIG. 2C illustrates the TX operations, with the active transmit blocks and selected active RX blocks shaded. (Block 225, including the 1/0 circuits, clock circuitry, and control buffers, are not shown in FIG. 2D for clarity).

The RX operations are generally the same as described above for FIG. 2C; however, during TX operations, Channel 2 is used to provide the input signal to DPD system 200. In the preferred embodiment, an internal coupling path within the radio 214 feeds-back a signal representing the TX burst to one of the RX_MAIN and RX_DIV input paths. (In alternate embodiments, the signal at the TX antenna may be strong enough or boosted to allow wireless reception of the feedback signal through the RX antenna.) This signal is multiplexed through by crossbar 223 to the Channel 2 DOC 224*b*, downconverted and processed, and then passed to DPD system 200. The feedback available through the RX paths of radio 214 during the TX burst allow the DPD system to improve the polynomial coefficients of the inverse plant model in advance of the next TX burst.

Figure 9:
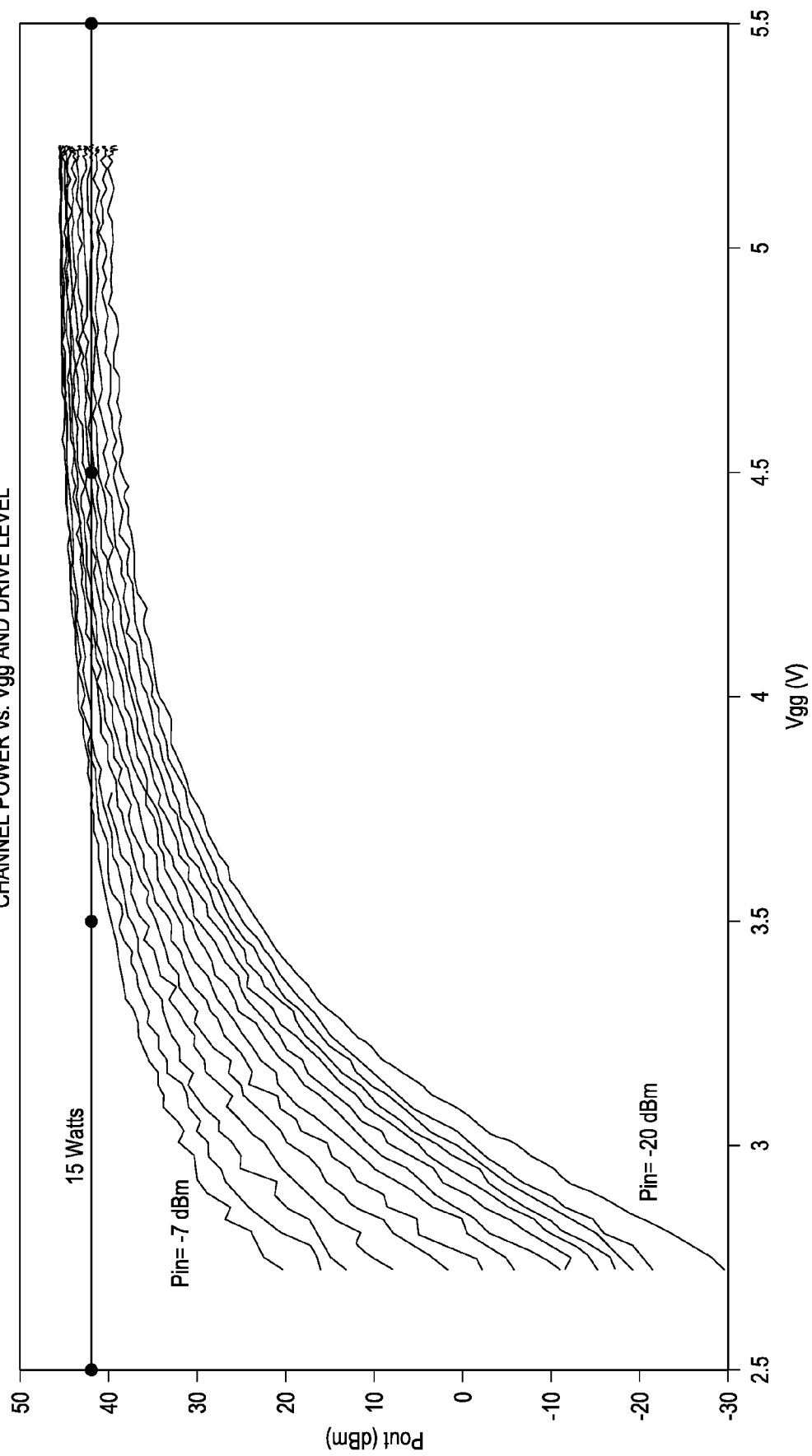
FIG. 9 shows the channel power versus gate bias voltage (Vgg) and the amplifier input drive level during testing of the wayside radio using the test system of FIG. 7.

In the preferred embodiment, the transfer function of plant 203 was estimated from empirical data obtained by observing the plant nonlinear behavior for various input drive and input bias levels, as shown in FIG. 9. The preferred predistortion polynomial (inverse plant model) is:

$$p(x) = \sum_{i=0}^{n} a_i x^i = a_0 + a_1 x + a_2 x^2 + a_3 x^3 + \ldots + a_n x^n,$$

The terms of the polynomial and corresponding coefficients up to and including the 5th order (i.e., n=0 to 5) were implemented in the preferred embodiment.

The predistortion feedback mechanism has at its core, inverse adaptive controller 206 (FIG. 2A), which uses a differential gradient descent algorithm to perform updates to the polynomial coefficients. The preferred embodiment of the adaptive controller is discussed below in conjunction with FIG. 5.

In more traditional digital predistortion schemes, the hardware platform is designed such that the transmission and feedback paths have a finely controlled, well-known gain relationship and are both driven by the same oscillator source, which allows the transmit and feedback data streams to be phase-locked. In this case, the power amplifier (PA) transform can be implemented using a lookup table (LUT), with each symbol of the feedback stream being compared directly to its former state from the transmission path, and the LUT entry for that symbol can be updated via a least-mean-square (LMS) approach. In an ideal system, this could quickly converge to a solution and form an accurate inverse PA curve.

However, if instead this method were employed in an asynchronous environment, with an indirectly coupled feedback path (i.e., transmit path to receiver path), the performance would be very poor. Significant oversampling or resampling and phase reconstruction could mitigate performance loss due to these physical constraints, however, this would be computationally costly and potentially exceed the capabilities of the hardware platform.

The embodiments of the present principles design provide an efficient solution that works well in a non-standard environment, such as a radio with indirectly coupled asynchronous transmit and receive paths. Because of this fundamental difference in the radio architecture, minimizing the mean-square error of the feedback relative to the reference signal via a traditional gradient descent approach is not applicable. Instead, a "differential gradient descent" method is employed whereby the gradient is estimated from a difference operation between the previous two recorded values of a cost function to be minimized. Minimization is performed by driving this estimated derivative function to zero. Specifically, for the preferred embodiment:

(1) The cost function and control sensor for the feedback path is the peak IMO power estimate over the update interval and the control actuator(s) is the coefficient(s) of the DPD polynomial;

(2) Given an initial state, an actuation command is made via a small step change in the DPD coefficient(s);

(3) The IMO power is measured and compared to its previous state;

(4) If the IMO power has decreased, another step is introduced with the same sign as previously applied, otherwise a step is applied with the opposite sign; and (5) These small actuation deltas are continuously applied such that algorithm converges to an eventual small oscillation about the minimum sensed IMOpower.

Figure 5:
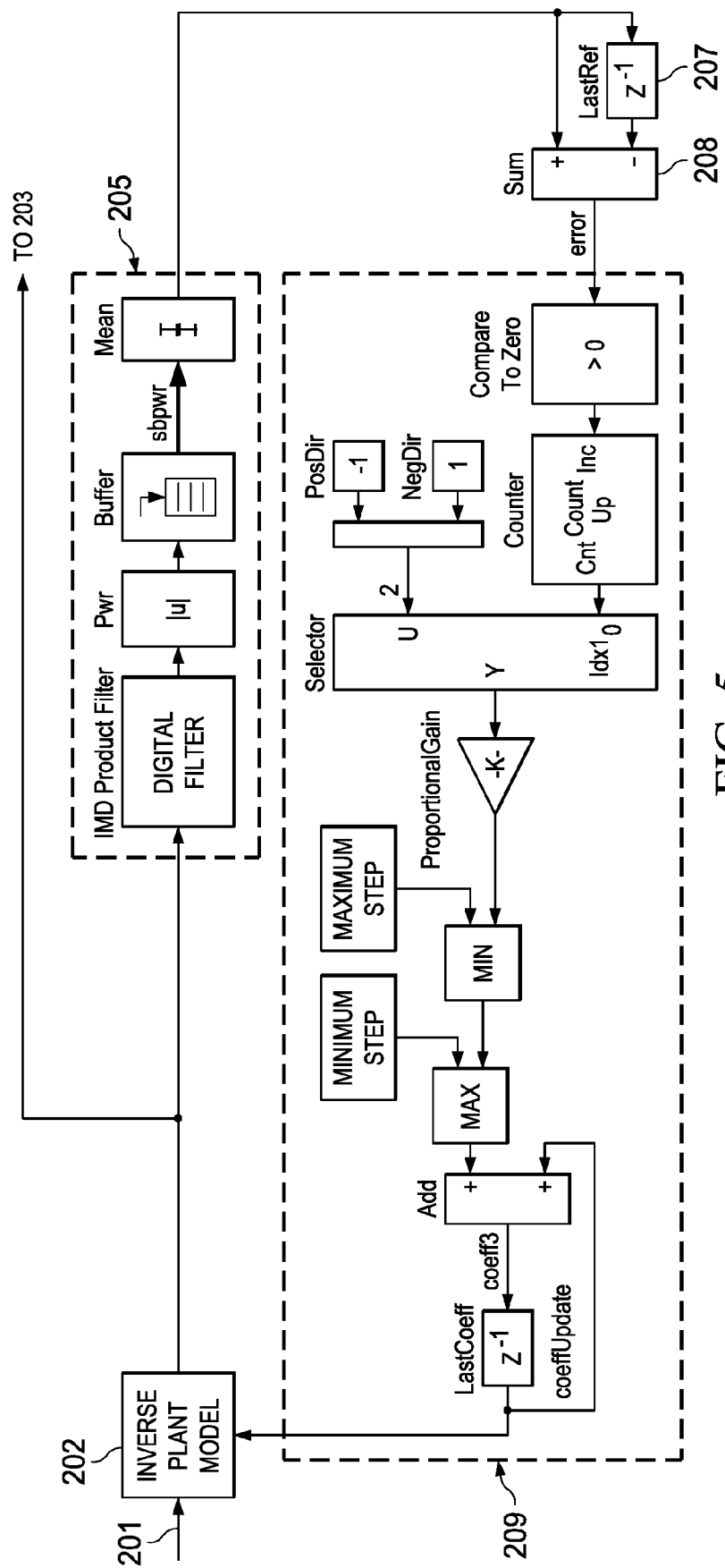
FIG. 5 is a block diagram of the adaptive controller shown in FIG. 2 in Simulink® notation.

FIG. 5 is a functional block diagram of digital predistortion system 200, in which the functional blocks of FIG. 2 are represented in Simulink® notation. The input signal 201 passes through inverse plant model 202 and the cubic polynomial described above is applied. The output from inverse plant model 202 provides the input to plant 203, which drives the radio transmitter output 204 (see FIG. 2). The output from plant 203, or alternatively a signal representing the output from plant 203, is also provided to the signal conditioning block 205 at the front end of the digital predistortion feedback loop.

Figure 3:
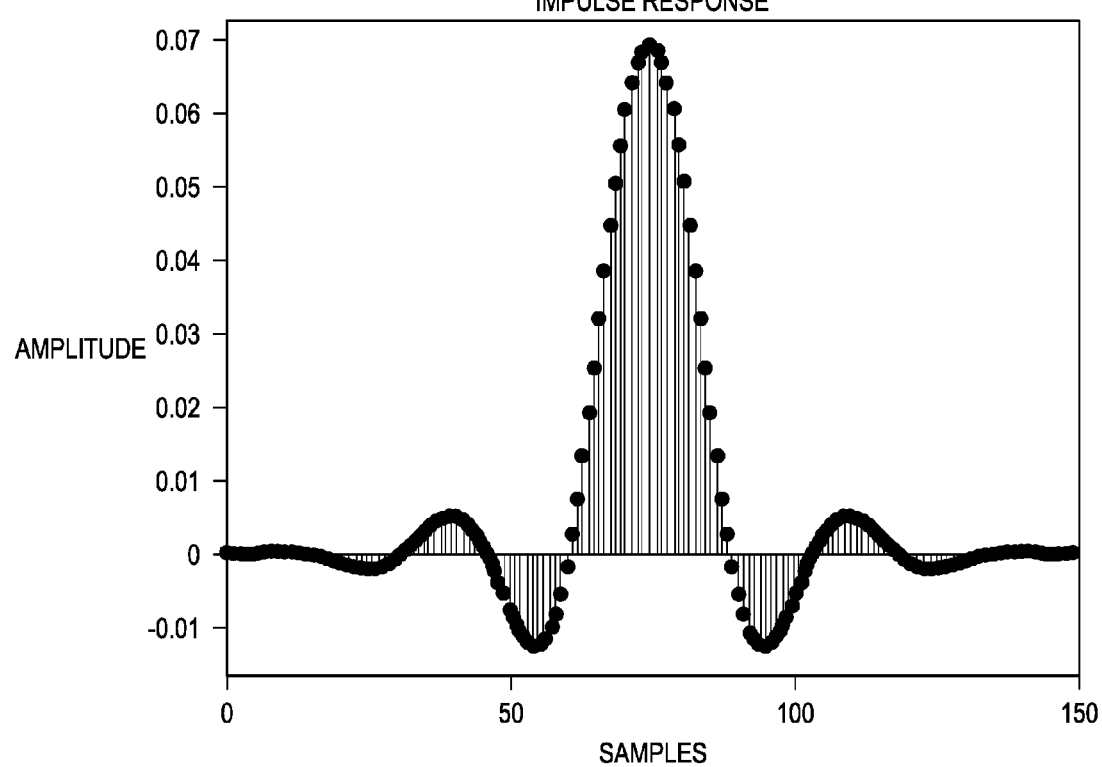
FIG. 3 shows the impulse response of the third order intermodulation (IMD3) lowpass filter within the signal conditioning block shown in FIG. 2.
Figure 4:
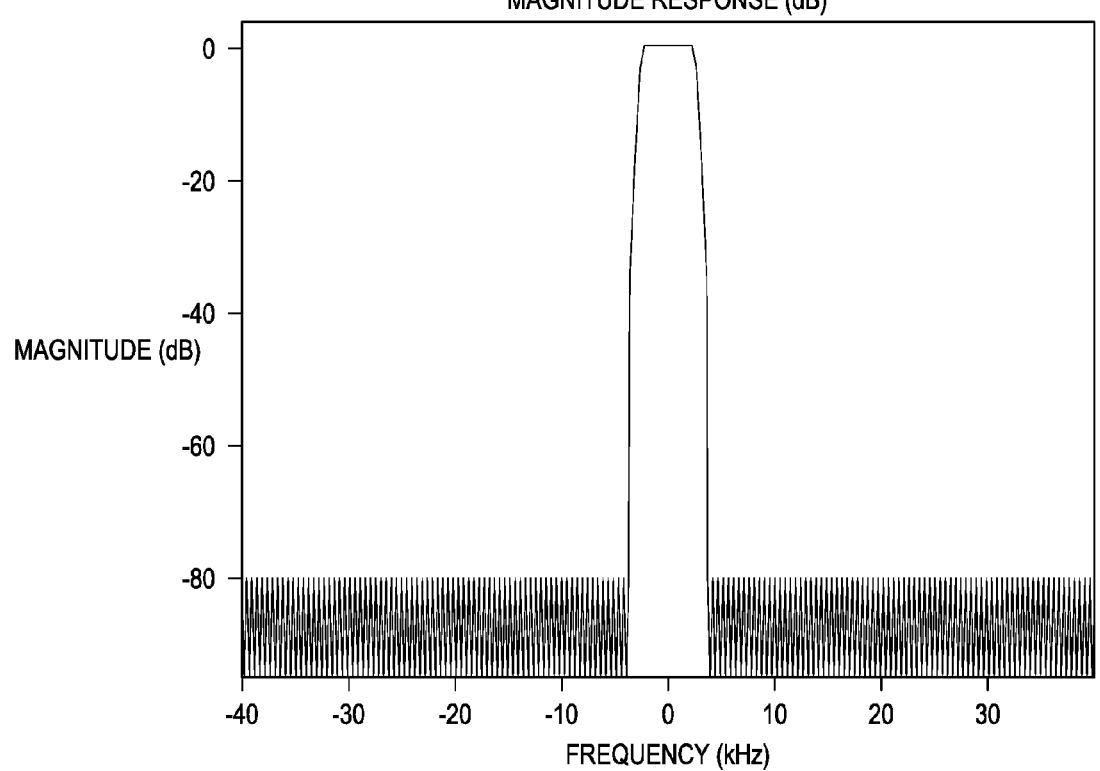
FIG. 4 shows the magnitude response of the IMD3 lowpass filter within the signal conditioning block shown in FIG. 2.

Signal conditioning block 205 includes an IMD3 lowpass filter, which isolates the energy contained in the third-order intermodulation distortion products at the amplifier output 204. In the preferred embodiment, the IMD3 lowpass filter is implemented as a 150 tap filter with an approximately 8 kHz passband and the same group delay as the radio channelizing and pulse matched filters. The impulse response and the magnitude response for the preferred IMD3 lowpass filter are shown in FIGS. 3 and 4, respectively. The IMD3 filter is preferably integrated with the input from the radio receiver CIC decimator stages and outputs to the peak power detector module. The connected receive stream is then tuned to a 19 kHz offset from the transmitting frequency to properly center the IMD3 filter on the third order intermodulation products by mixing to baseband. (The 19 kHz offset was experimentally derived using analysis from data capture and a vector signal analyzer and represents the offset frequency required to center on the dominant IMO product in the passband of the IMD3 lowpass filter. This offset value would be system dependent based on the transmission frequency, modulation, and transform characterizing plant 203.)

In order to gauge whether inverse plant model 202 is properly reciprocated with respect to plant 203 (via adaption of polynomial coefficients) and to ensure the radio is operating under the FCC emissions mask, it is desirable to measure of the peak spectral power of the third-order intermodulation products. Given a sufficiently narrow filter, the peak IMD3 power can be estimated by computing the $i^2$ and $q^2$ values on each sample output from the IMD3 filter and selecting the largest value in the timeframe between transmit start and transmit end. This form of power estimation is preferably implemented in a state machine within signal conditioning block 205.

Adaptive controller 206 processes the peak power estimates ("the control sensor") generated by signal conditioning block 205 and performs algorithmic and logical operations for updating the predistortion polynomial coefficients ("the control actuator") of inverse plant model 202. As indicated above, at least one coefficient, in the preferred embodiment the 3rd order coefficient $a_3$, is the control actuator and is continuously updated to converge the IMD3 products at the output of plant 203 to a small oscillation about the minimum sensed IMD3 power.

Specifically, adaptive controller 206 implements a unique variation on a gradient descent algorithm, which seeks to minimize the sensed IMD3 by updating the coefficients of the cubic polynomial implemented by inverse plant model 202 and then analyzing the difference in IMD3 power before and after the update. If the IMD3 power has decreased, another coefficient update is made in the same direction as was previously successful; if instead the IMD3 power has increased, a coefficient update is made in the opposite direction. In this way, small deltas are always being applied to the coefficient values such that a path of decreasing IMD3 power can be followed and eventual convergence to a small oscillation about the minimum. Proper choices for parameters such as step size and number of averages are important to consider on an implementation by implementation basis. In the illustrated embodiment of FIG. 5, the adaptive controller applies steps of minimum and maximum sizes to bound the output of the control gain block. The minimum of either the proportional gain output or the maximum step size is selected and the maximum of that value or the minimum step size is selected.

As a result of the expansion effect of digital predistortion (i.e., the inverse of the compression effect of the PA), peak power grows if left uncompensated. An empirical relationship between the third-order coefficient and predistortion gain was therefore derived for maximum power (44 dBm). This gain is then nullified through manipulation of the zeroth-order polynomial coefficient a0. While this was sufficient for proof of concept, a power compensation relationship should be derived across multiple power levels (~38-44 dBm for instance). It was also found that a fixed non-zero value for the fifth-order coefficient $a_0$ proved beneficial on all radios across all temperatures. This may be considered further for simplification to a simple lookup table vs temperature.

A set of experiments was run to determine whether predistortion could in fact be successfully implemented in a radio with asynchronous transmit and receive paths and what constraints are present with regard to manufacturing calibration and performance over temperature and voltage.

Figure 6:
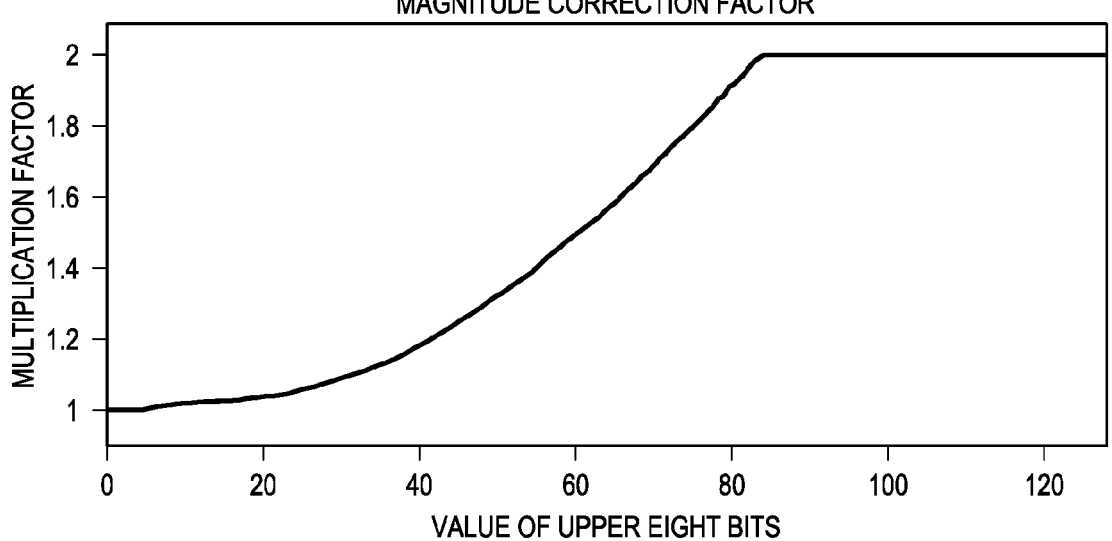
FIG. 6 is a magnitude correction curve suitable for analyzing the performance of the adaptive controller shown in FIG. 5.

Initially, correction curves were applied to the baseband data via a field programmable gate array (FPGA) in both the amplitude and phase domains. These curves were derived from data taken on a vector network analyzer. The multiplication factor applied to the upper bits of the magnitude is shown in FIG. 6. Similarly, phase correction was applied as an offset to the phase word.

Figure 7:
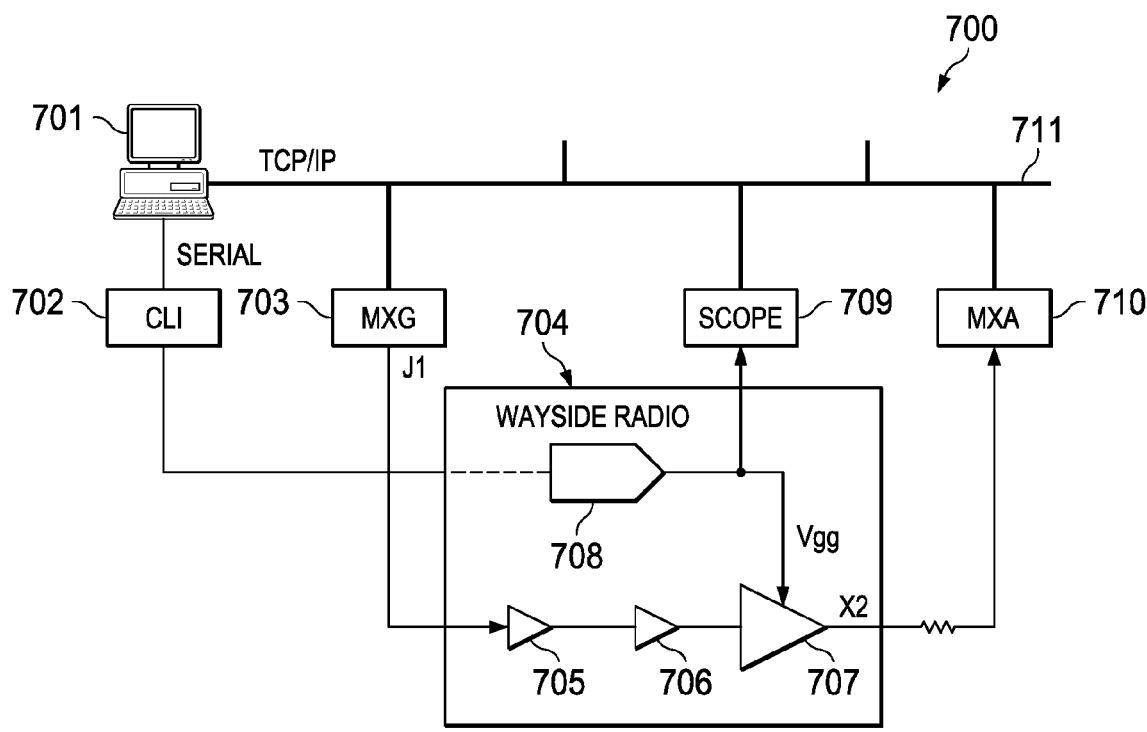
FIG. 7 shows a preferred prototyping system for evaluating the performance of a wayside radio using the digital predistortion system in FIG. 2, where the signal conditioning, adaptive algorithm, and predistortion polynomial are realized within an external computer.

The equipment arrangement for the linearization analysis is shown in FIG. 7, Data were taken on a wayside radio, similar to that shown in U.S. Pat. No. 8,279,796, at room temperature and with a 13.88 VDC supply voltage. Inverse plant model 202, signal conditioning block 205, and adaptive controller 206 were implemented using a computer system 701. A command line interface (CLI) 702 was used to control various radio parameters. In particular, CLI 702 controls DAC 708 driving power amplifier (plant) 707 through a controller (not shown) on the wayside radio.

An Agilent N5182A MXG signal generator 703 was used to drive the input of the transmitter stages 705 and 706 with a n/4 DQPSK modulated signal and an Agilent MXA signal analyzer 710 was used to measure power and intermodulation products output from power amplifier 707. An oscilloscope 709 was used to monitor the gate bias voltage Vgg applied to the gate of the field effect transistor of the power amplifier 707 through a digital to analog converter (DAC) 708. RF data generation and RF analysis and scope data collection were performed, along with post-processing and visualization, within the MATLAB® environment.

The initial data collection effort was focused on characterizing the transmitter chain without predistortion. A PN9 modulation sequence using a 16 ksym/s rate and a TX Nyquist filter was downloaded to MXG signal generator 703 and the drive level and gate bias voltage $V_{gg}$ were varied while the channel power and the third order and fifth order products were measured. Specifically, the transmit amplifier input drive level into transmit drive circuit 705 was varied from −20 dBm to −7 dBm in 1 dB steps and the 10-bit Vgg DAC setting was varied from 500 to 1020 in increments of 5. The corresponding analog gate voltage range is shown in FIG. 8.

Figure 8:
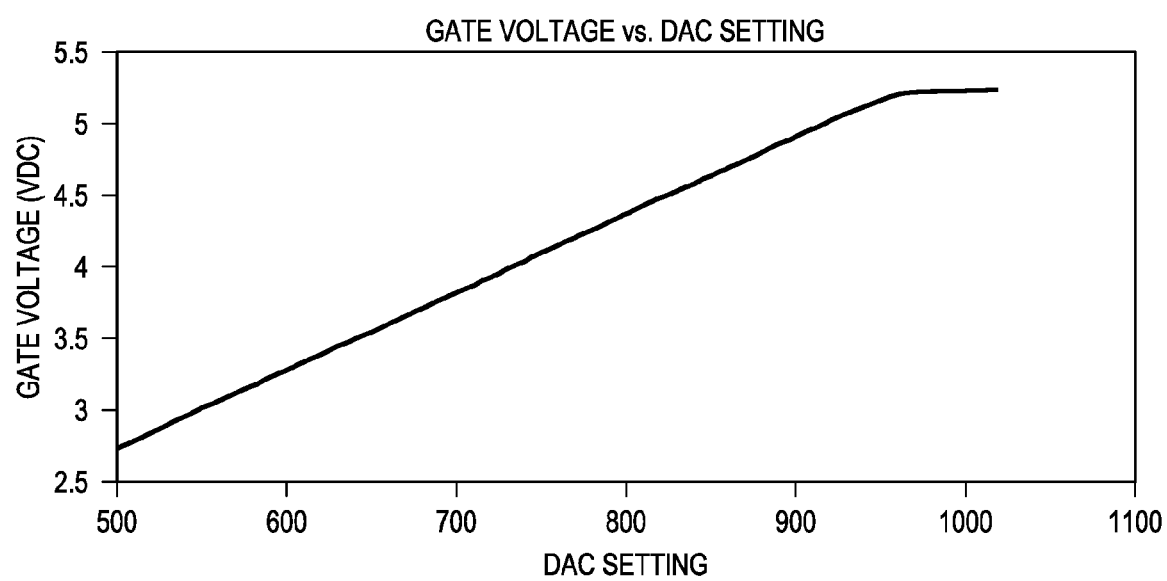
FIG. 8 shows the gate bias voltage (Vgg) versus digital to analog converter (DAG) setting during testing of the wayside radio using the test system of FIG. 7.

The flat region at the top of the curve of FIG. 8 indicates that some optimization could be done to the DAC scaling circuit to give a linear control response over the entire DAC range, but this is not expected to be a factor in the gate bias voltage region of interest around 5 V.

Figure 10:
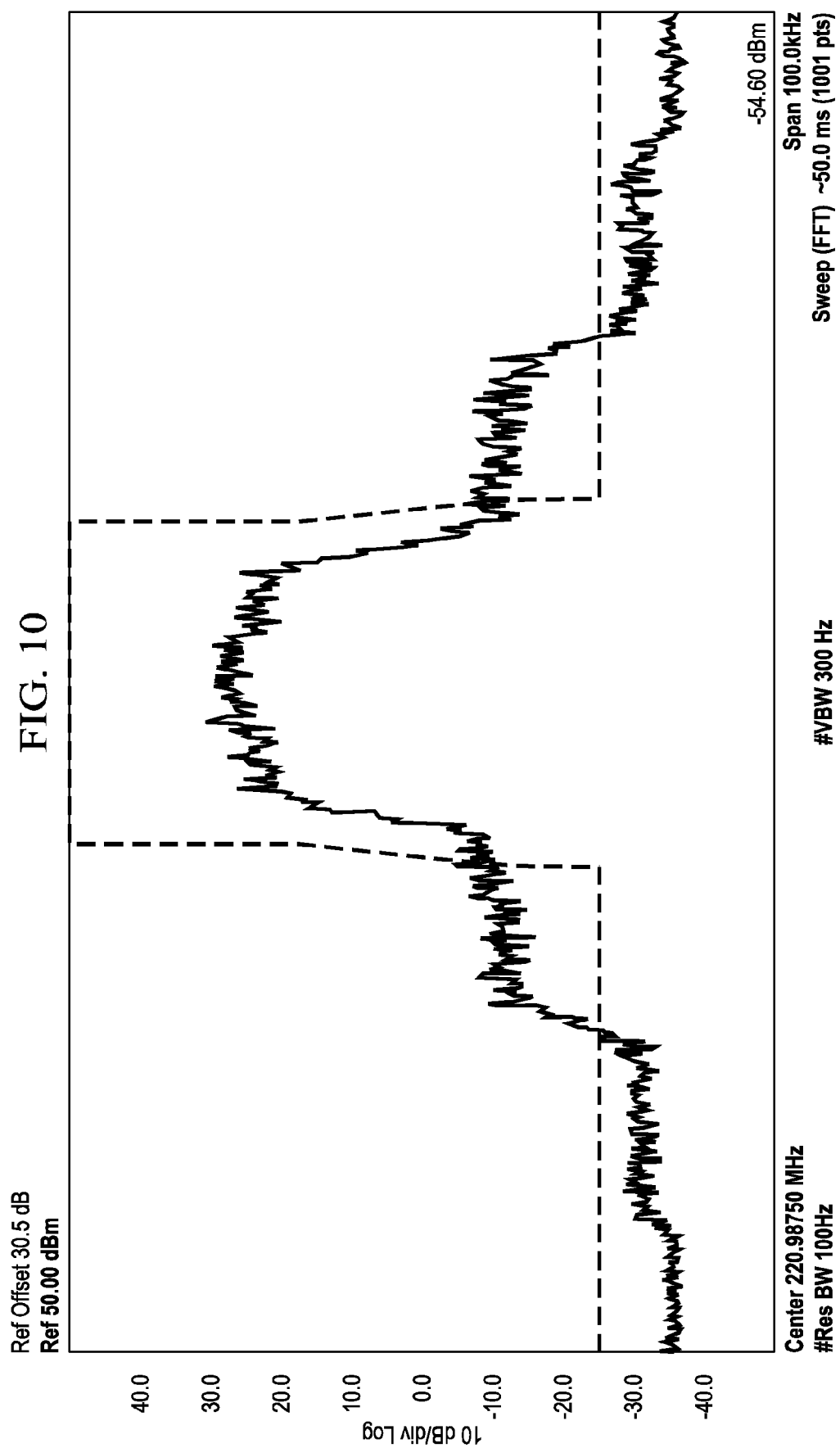
FIG. 10 shows the uncorrected output spectrum from the wayside radio under test in the test system shown in FIG. 7.
Figure 11:
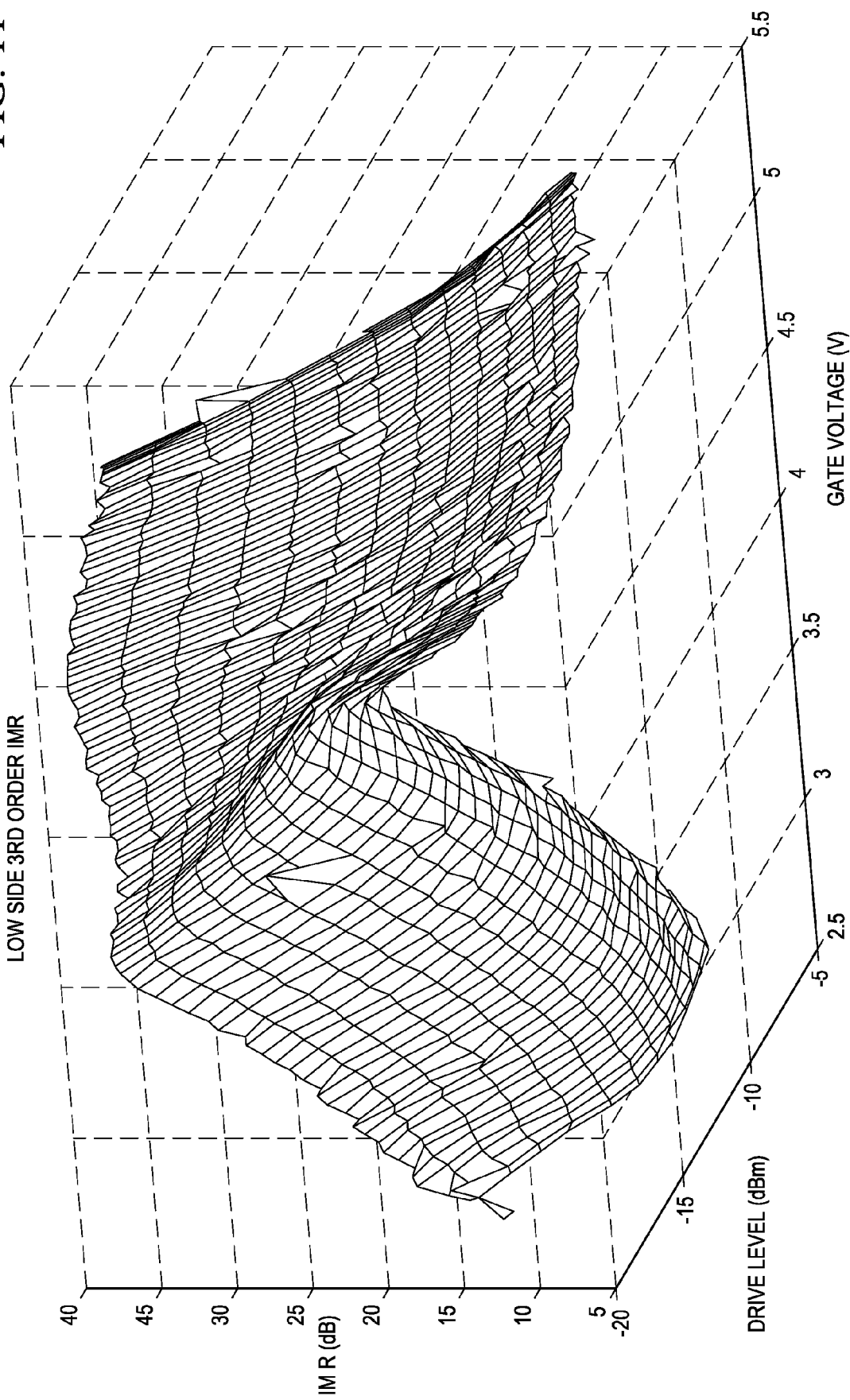
FIG. 11 shows the optimal third order intermodulation products, low side, output from the wayside radio as a function of drive level and gate voltage in the test system shown in FIG. 7.
Figure 12:
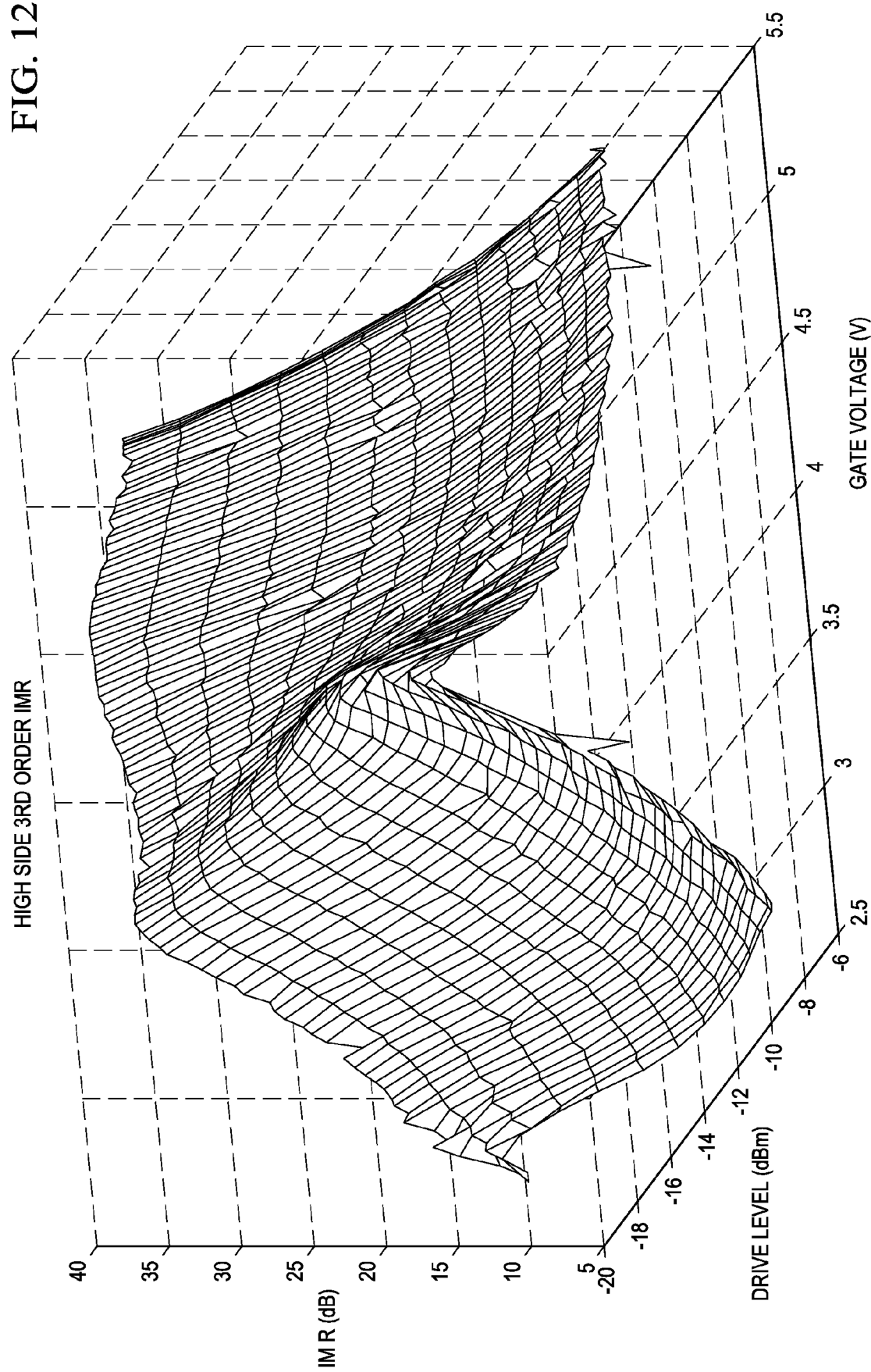
FIG. 12 shows the optimal third order intermodulation products, high side, output from the wayside radio as a function of drive level and gate voltage in the test system shown in FIG. 7.
Figure 13:
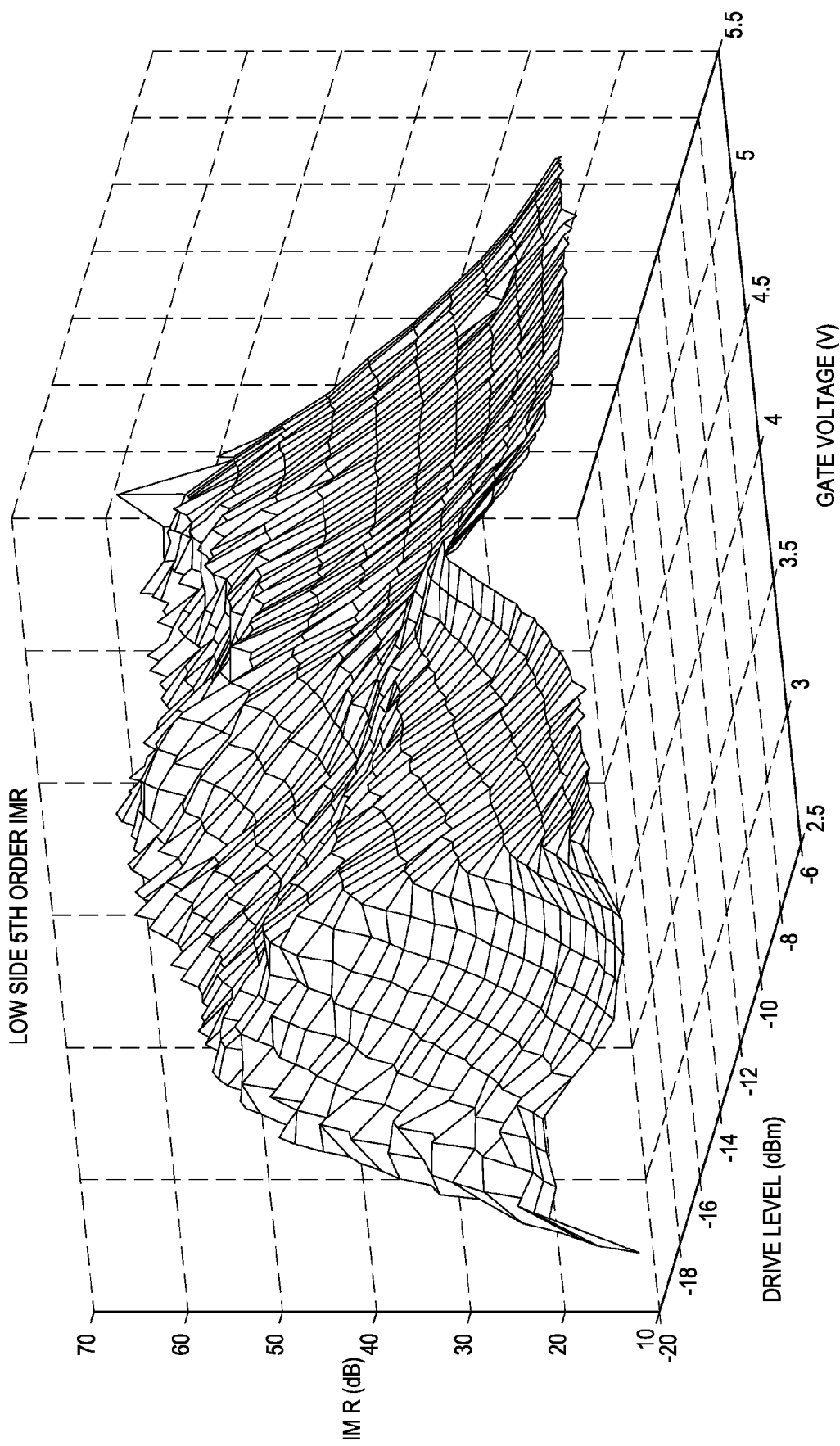
FIG. 13 shows the optimal fifth order intermodulation products, low side, output from the wayside radio as a function of drive level and gate voltage in the test system shown in FIG. 7.
Figure 14:
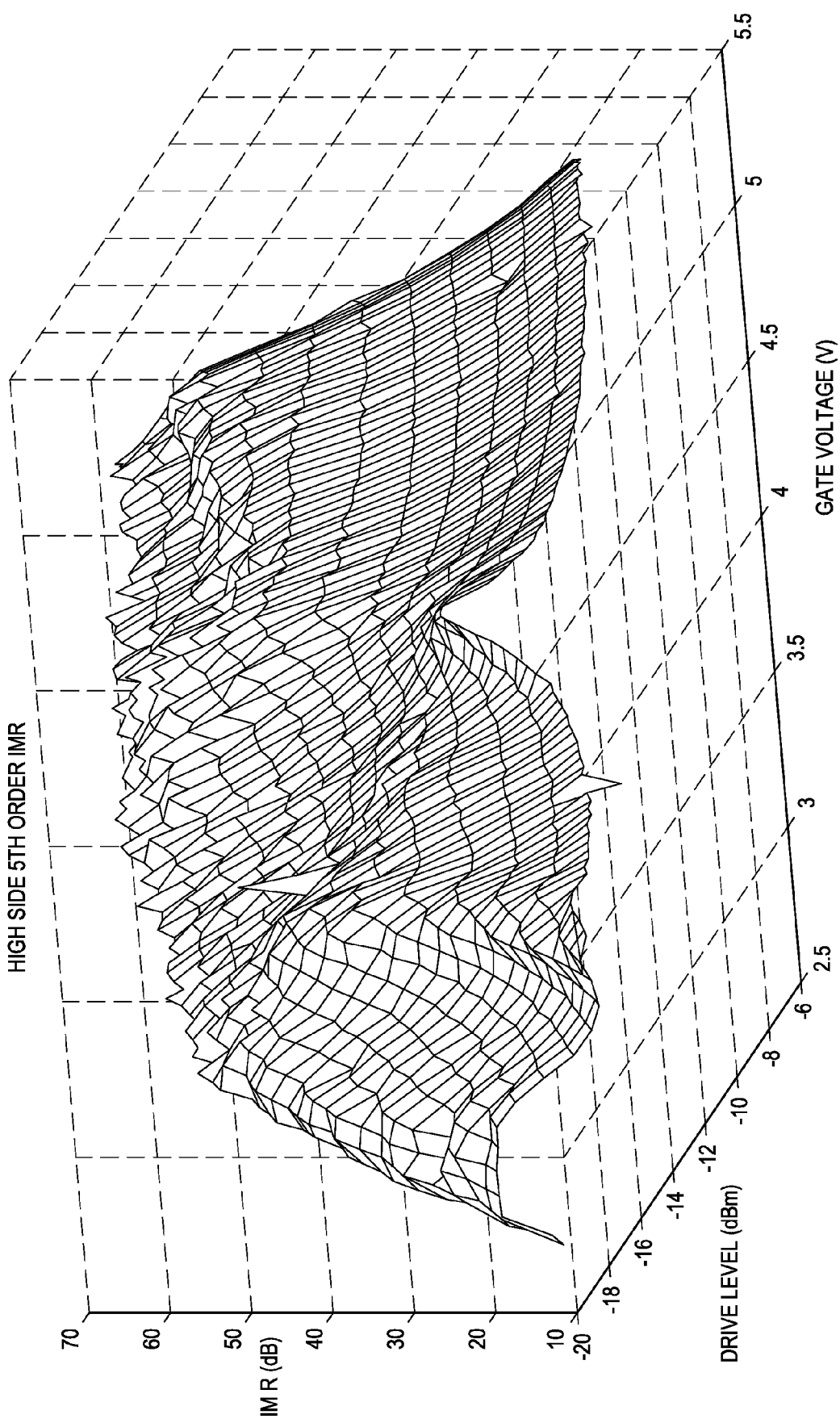
FIG. 14 shows the optimal fifth order intermodulation products, high side, output from the wayside radio as a function of drive level and gate voltage in the test system shown in FIG. 7.

FIG. 9 shows channel power as drive level and gate voltage are varied. For this measurement, the spectrum analyzer was set for a resolution bandwidth of 300 kHz and the trace averaged. At a drive level of −19 dBm the radio transmitter provides 10 W average power. As a reference, the spectrum without correction is measured, as shown in FIG. 10.

FIGS. 11-14 provide a series of plots, which quantify the 3rd order and 5th order performance of the amplifier as the gate bias voltage and drive are varied. All measurements used a 100 Hz bandwidth. For each combination, the power levels of the intermodulation products are compared with the power level at center frequency. These comparisons were made for figure of merit purposes rather than to provide absolute emissions power levels. To highlight maxima, the data are plotted as a 30 mesh. (The use of the 5th order polynomial coefficient advantageously provides better curvature match of the inverse PA transform than 3rd order alone. In the illustrated embodiment, the 5th order coefficients were not used to avoid complexity. However, although the 5th order components would introduce a more complex control problem if a second IMO sensor feedback path were added, the 5th order IMDs could be used to improve the inverse polynomial coefficients.)

As a starting point, the magnitude correction curve of FIG. 6 was fit to a 3rd order polynomial to generate a fixed lookup table for the entire input voltage range. This table was applied to the test I Q file, by varying the input drive level and scaling. Changing the scaling adjusts how aggressively the correction curve is applied. At low scale values the correction is unity throughout the input range, at high scale the correction is limited to 2× for high input voltages.

Figure 15:
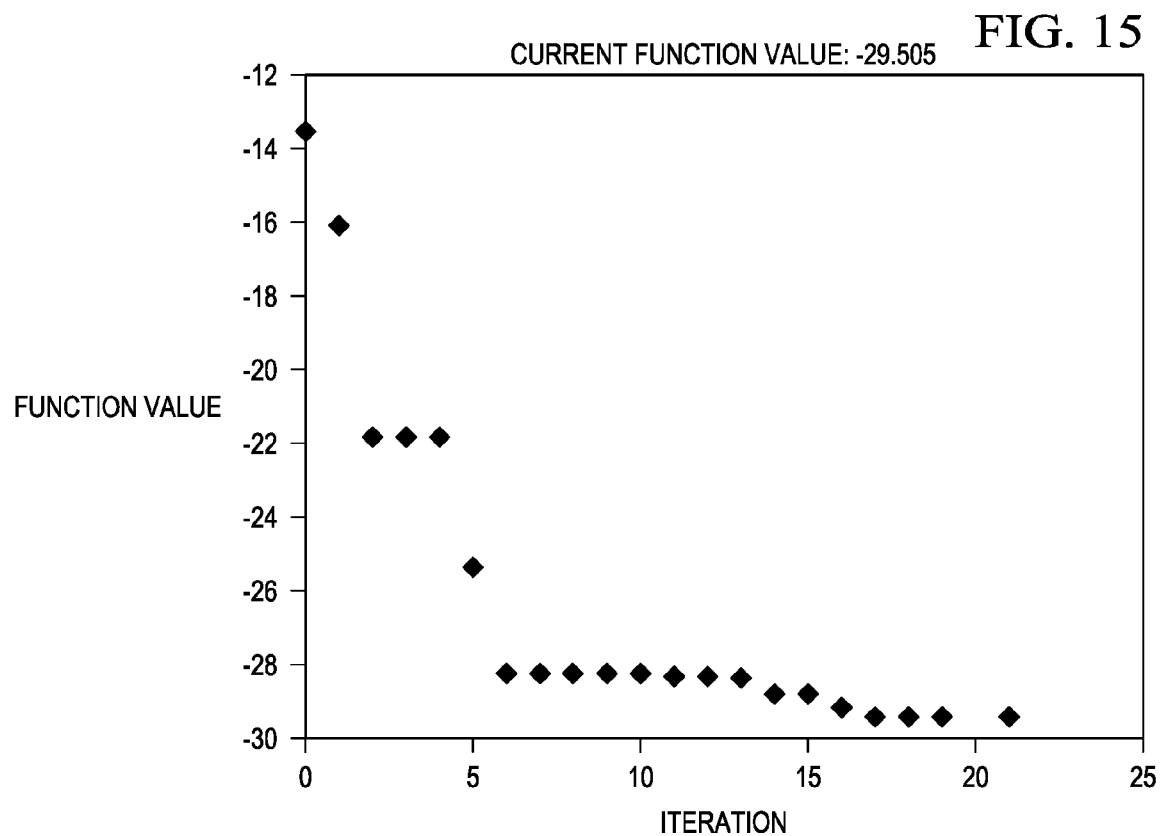
FIG. 15 shows the resulting optimization sequence using the test system shown in FIG. 7 in which the function value is IM3 power.

This procedure had limited success, since the correction curve was based on a power correction table rather than voltage correction, which is more suitable for I Q manipulation. To improve results, the MATLAB® fminsearch optimization function was used to arrive at a new set of polynomial coefficients, given an initial set based on the measured amplifier voltage transfer function. A typical optimization run is shown in FIG. 15. The specific form of the polynomial, taken from the general form given above, which could be implemented in a table to save multiply operations, is:

$$\text{CorrectionFactor} = 1.49 * V\text{in}^4 - 1.55 * V\text{in}^3 + 0.57 * V\text{in} + 0.0020 * V\text{in} + 1.14$$

Figure 17:
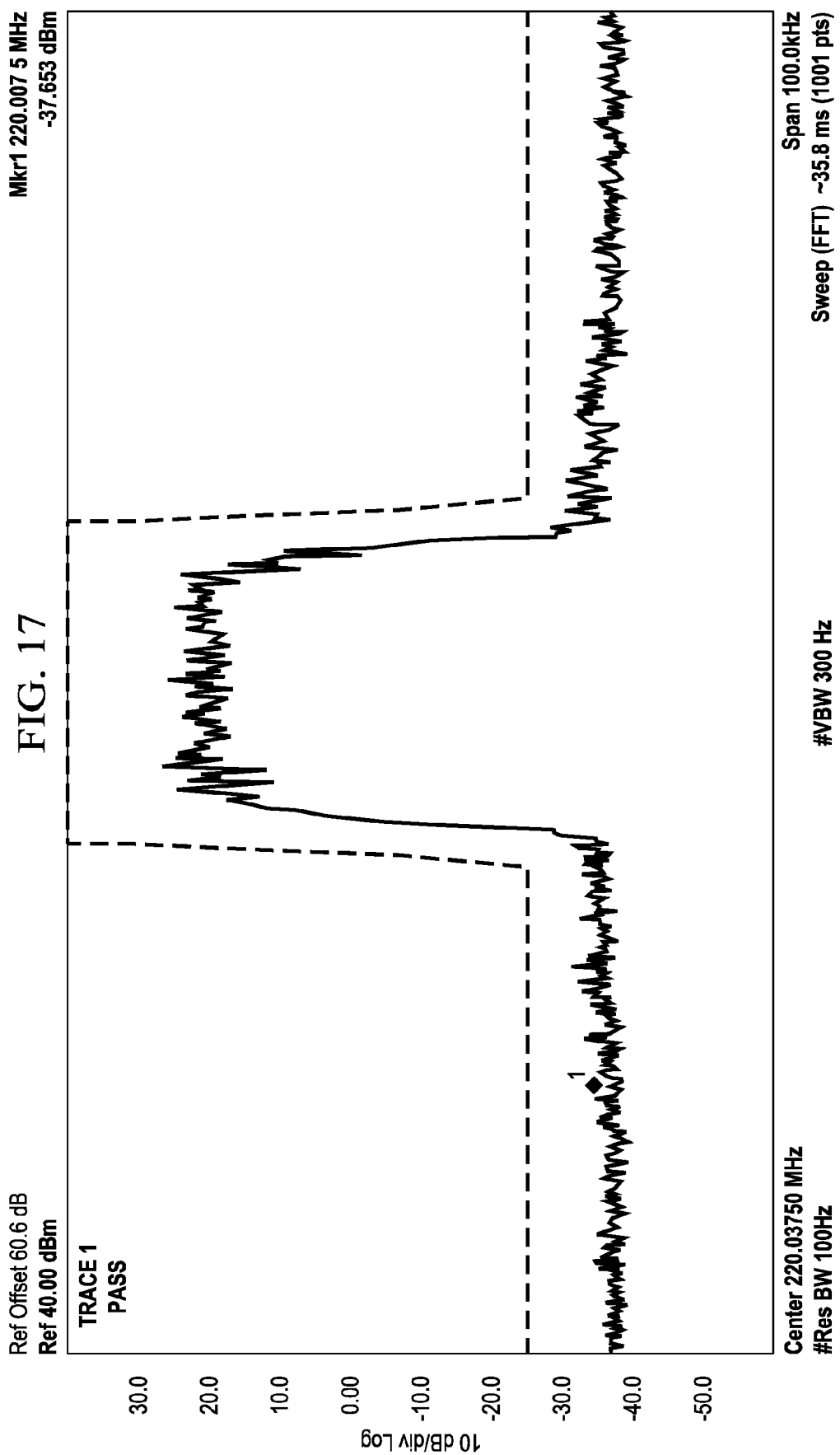
FIG. 17 shows a corrected output from the wayside radio under test in the test system shown in FIG. 7 at six (6) Watts output power.
Figure 18:
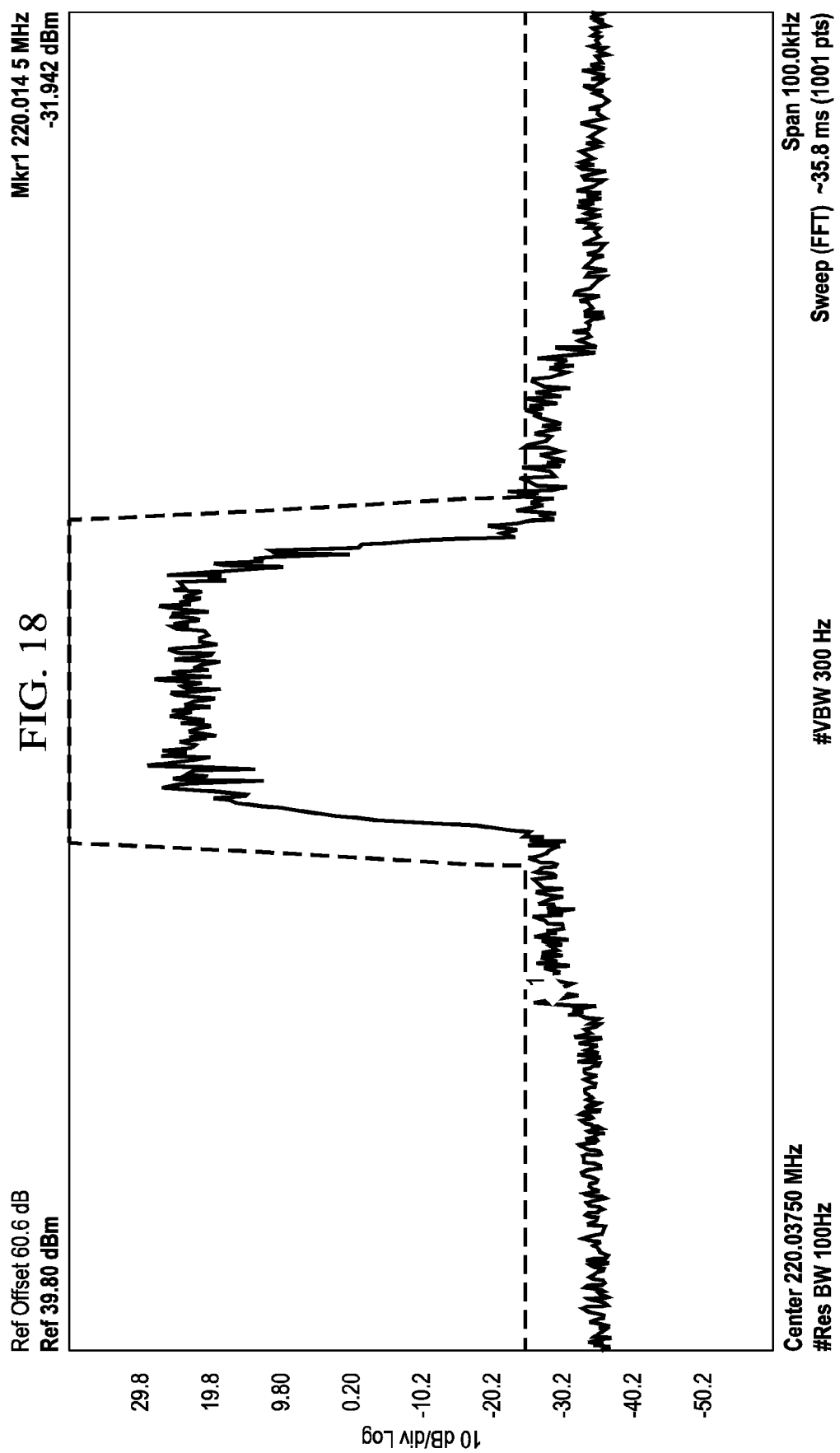
FIG. 18 shows a corrected output from the wayside radio under test in the test system shown in FIG. 7 at twelve (12) Watts output power.
Figure 19:
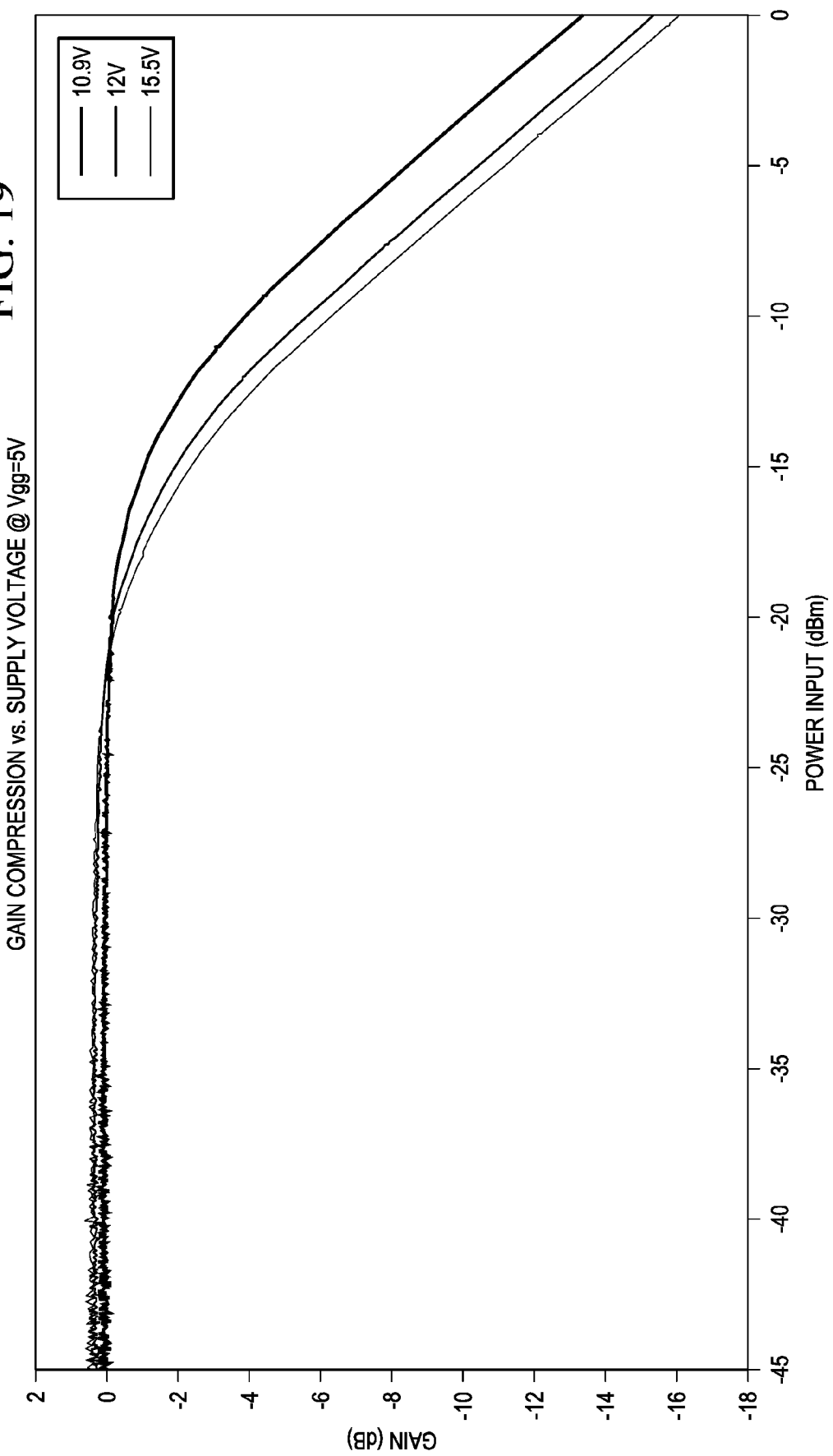
FIG. 19 shows the gain compression versus supply voltage for the wayside radio under test in the test system shown in FIG. 7.

This approach yielded much better results as shown in FIG. 17. Error vector magnitude with this level of correction was 2%. Given this initial success, further network analyzer data was gathered at high power levels with various bias voltages and low, mid, and high power supply voltages. This large dataset was replicated on two different wayside radios to give an indication of unit-to-unit variation as well.

Figure 16:
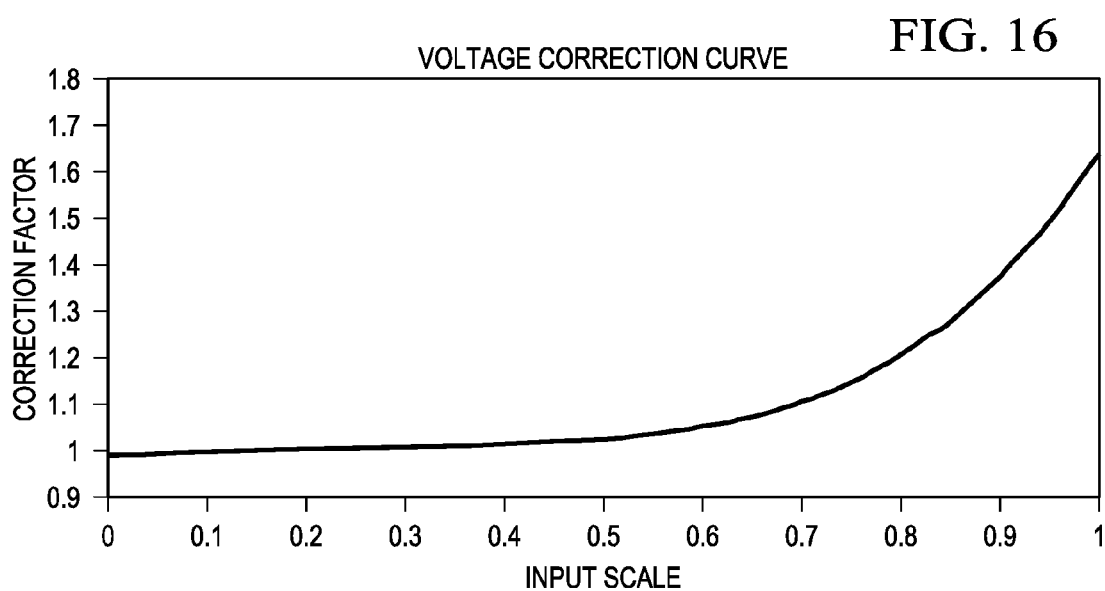
FIG. 16 shows a representative voltage correction curve.

These data highlights the challenge of applying a fixed predistortion curve to the transmitter with an unregulated supply voltage. The knee of the voltage correction curve shown in FIG. 16 is the critical portion of the response but its location varies directly with voltage. However, the radio does have a regulated analog-to-digital converter measuring both supply voltage and PA temperature. Relative offsets from ideal conditions could be applied to the correction curve to shift it in the appropriate direction.

One alternate topology of the present principles uses polar modulation, which provides better control of phase and magnitude non-linearity compensation. In a direct polar modulation approach, the drive signal is phase modulated and the amplitude variation between symbols is directly controlled by the gate voltage to the amplifier. This is a type of envelope tracking amplifier configuration. The current wayside circuit design does not allow for this approach so it was not part of this investigation, but it should be considered for future radio generations.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. In a wireless radio for positive train control system, a method of linearizing a relationship between an RF input signal to a power amplifier and an RF output signal from the power amplifier, the power amplifier having a response to an input signal characterized by a predetermined transfer function, the method comprising:
    applying an inverse of the transfer function to the RF input signal prior to the amplifier amplifying the input signal, the inverse transfer function being represented by a polynomial having a set of coefficients;
    amplifying the RF input signal;
    minimizing a parameter value of an intermodulation product in the RF output signal by updating at least one coefficient of the polynomial corresponding to the intermodulation product according to a differential gradient descent algorithm based on differences in the parameter value of the intermodulation product between updates to the at least one coefficient.

2. The method of claim 1, wherein applying a differential gradient descent algorithm comprises:
    in response to an estimate of a peak power of the isolated intermodulation product for a first transmit time period, stepping a value of a coefficient of the set of coefficients of the polynomial representing the inverse of the transfer function of the amplifier by a first step;
    comparing the peak power of the isolated intermodulation products for the first transmit period with an estimate of the peak power of the isolated intermodulation products for a second transmit time period subsequent to stepping the value of the coefficient;
    in response to the comparison:
    if the estimate of the peak power of the isolated intermodulation products decreases from the first transmit period to the second transmit period, stepping the value of the coefficient by a second step having a sign equal to the sign of the first step; and
    if the estimate of the peak power of the isolated intermodulation products increases from the first transmit period to the second transmit period, stepping the value of the coefficient by a second step having a sign opposite to the sign of the first step.

3. The method of claim 2, wherein the selected order of the intermodulation products is the third order.

4. The method of claim 1, wherein the power amplifier comprises a transmitter output amplifier in a radio system having a transmitter and a receiver operating in a time domain duplexing mode, and the method further comprises:
    during each of a plurality of transmit periods, processing a signal representing the output signal with the receiver for filtering and isolating the intermodulation products.

5. The method of claim 4, wherein processing a signal representing the output signal comprises coupling a transmit path in the transmitter and a receive path in the receiver.

6. The method of claim 5, wherein the receive path of the receiver comprises a selected one of a plurality of parallel receive paths in a multiple-channel receiver.

7. A radio system for a positive train control system comprising:
    a power amplifier for amplifying an RF input signal and producing an RF output signal for transmission, the power amplifier characterized by an amplifier transfer function; and
    a digital predistortion system coupled with the power amplifier comprising,
        an inverse model for applying an inverse to the power amplifier transfer function to the RF input signal that is characterized by an inverse transfer function polynomial having a set of coefficients;
        a signal conditioning block for sensing a parameter value of an intermodulation product in the RF output signal; and
        an adaptive controller using a differential gradient descent algorithm to step a value of at least one of the coefficients of the inverse transfer function based on differences between the sensed parameter values before and after each update.

8. The radio system of claim 7, wherein the parameter of the intermodulation product sensed by the digital predistortion system is comprised of an estimated peak power for a transmit time period.

9. The radio system of claim 7, wherein the intermodulation product is the third-order modulation product.

10. The radio system of claim 7, wherein the selected coefficient is a third order coefficient of the inverse transfer function polynomial.

11. The radio system of claim 7 further comprising:
    a radio receiver operable to process a signal representing RF output signal during each transmit time period and provide the output signal to the digital predistortion system.

12. The radio system of claim 11, wherein the radio receiver comprises a multiple channel receiver and processes the signal representing the RF output signal through a selected one of a plurality of receive channel paths.

13. The method of claim 1, wherein the intermodulation product is a third order intermodulation product.

14. The method of claim 1, wherein the radio has indirectly coupled asynchronous transmit and receive paths.

15. The method of claim 1, wherein the parameter value is an estimated peak power of the intermodulation product during a transmit period; and minimizing comprises updating the at least one coefficient of the polynomial after each transmit period.

16. The method of claim 1, wherein updating comprises sensing the parameter value during successive transmit periods and stepping the value of the at least one coefficient after each transmit period; each stepping of the value of the at least on coefficient comprising comparing the difference of the sensed parameter value before and after a prior step and, if the parameter decreases, stepping the value of the at least one coefficient in the same direction as the prior step, and, if the sensed intermodulation product increases, stepping the value of the at least one coefficient in a direction opposite the prior step.

17. The radio system of claim 7, wherein the adaptive controller compares the difference of the sensed parameter value before and after a prior step in the value the at least one coefficient and, if the sensed parameter value decreases, steps the value of the at least one coefficient in the same direction as the direction of the prior step, and, if the sensed intermodulation product increases, stepping the value of the at least one coefficient in a direction opposite the direction of the prior step.

18. The radio system of claim 7, wherein the parameter value is sensed during each transmit period and the adaptive controller steps the value of the at least one of the coefficients after each transmit period.

* * * * *